(12) United States Patent
Baggen et al.

(10) Patent No.: US 9,980,332 B2
(45) Date of Patent: May 22, 2018

(54) CIRCUIT AND METHOD FOR CONTROLLING PULSE WIDTH MODULATION OF A CURRENT SUPPLY FOR A LOAD

(71) Applicant: PHILIPS LIGHTING HOLDING B.V., Eindhoven (NL)

(72) Inventors: Constant Paul Marie Jozef Baggen, Blerick (NL); Stephanus Joseph Johannes Nijssen, Eindhoven (NL)

(73) Assignee: PHILIPS LIGHTING HOLDINGS B.V., Eindhoven (NL)

( * ) Notice: Subject to any disclaimer, the term of this patent is extended or adjusted under 35 U.S.C. 154(b) by 0 days. days.

(21) Appl. No.: 15/118,984

(22) PCT Filed: Jan. 30, 2015

(86) PCT No.: PCT/EP2015/051868
§ 371 (c)(1),
(2) Date: Aug. 15, 2016

(87) PCT Pub. No.: WO2015/121079
PCT Pub. Date: Aug. 20, 2015

(65) Prior Publication Data
US 2017/0071041 A1    Mar. 9, 2017

(30) Foreign Application Priority Data

Feb. 14, 2014    (EP) .................................... 14155173

(51) Int. Cl.
*H05B 37/02*    (2006.01)
*H05B 33/08*    (2006.01)
*H03K 7/08*    (2006.01)

(52) U.S. Cl.
CPC .......... *H05B 33/0845* (2013.01); *H03K 7/08* (2013.01); *H05B 33/0815* (2013.01); *H05B 33/0818* (2013.01)

(58) Field of Classification Search
CPC ............ H05B 33/0845; H05B 33/0815; H05B 33/0818; H03K 7/08
See application file for complete search history.

(56) References Cited

U.S. PATENT DOCUMENTS 7,177,166 B1 *    2/2007    Kris ........................ H02M 1/12
                                                              323/282
9,781,784 B2 *    10/2017   Patil ................... H05B 33/0815
(Continued)

FOREIGN PATENT DOCUMENTS

| CN | 102316621 A | 1/2012 |
|---|---|---|
| WO | 2012028554 A1 | 3/2012 |
| WO | 2012052935 A1 | 4/2012 |

*Primary Examiner* — Tung X Le
*Assistant Examiner* — Raymond R Chai
(74) *Attorney, Agent, or Firm* — Meenakshy Chakravorty (57) ABSTRACT

A circuit comprising a controller (2) for controlling a pulse width modulated input signal, and a driver (4) configured to supply current to a load (6) based on the input signal, wherein over the on time of each pulse width modulation period the driver (4) supplies current to the load (6) with a second frequency that is greater than the first frequency. The controller (2) is configured to control the duty cycle to set the output of the load (6) to a desired output level, and to dither the duty cycle about a point corresponding to the desired output level.

14 Claims, 9 Drawing Sheets

(56) References Cited

U.S. PATENT DOCUMENTS

| | | | |
|---|---|---|---|
| 2007/0103086 A1 | 5/2007 | Neudorf et al. | |
| 2010/0156319 A1* | 6/2010 | Melanson | H05B 33/0839 |
| | | | 315/297 |
| 2011/0193648 A1 | 8/2011 | Zhao | |
| 2011/0316502 A1* | 12/2011 | Tang | H02M 3/156 |
| | | | 323/271 |
| 2012/0104974 A1 | 5/2012 | Saes et al. | |
| 2012/0299500 A1* | 11/2012 | Sadwick | H05B 33/0815 |
| | | | 315/224 |
| 2013/0049634 A1* | 2/2013 | Neudorf | H05B 33/086 |
| | | | 315/294 |
| 2013/0202310 A1* | 8/2013 | Rietman | H05B 37/0272 |
| | | | 398/128 |
| 2014/0232196 A1* | 8/2014 | Cameron | G05F 1/67 |
| | | | 307/82 |

\* cited by examiner

CIRCUIT AND METHOD FOR CONTROLLING PULSE WIDTH MODULATION OF A CURRENT SUPPLY FOR A LOAD

CROSS-REFERENCE TO PRIOR APPLICATIONS

This application is the U.S. National Phase application under 35 U.S.C. § 371 of International Application No. PCT/EP2015/051868, filed on Jan. 30, 2015, which claims the benefit of European Patent Application No. 14155173.9, filed on Feb. 14, 2014. These applications are hereby incorporated by reference herein.

TECHNICAL FIELD

The present disclosure relates to controlling a pulse width modulated input signal applied to a driver in order to drive a load.

BACKGROUND

Pulse width modulation (PWM) is a technique for controlling the power supplied to a load. A controller such as a microprocessor generates a periodic control signal which is modulated such that in each period, the signal is asserted for a certain time (the on time) and de-asserted for the rest of the period (the off time). The duty cycle refers to the ratio of the on time to the modulation period (or more generally the proportion of the on time relative to the period or off time). Note that on "on" and "off" may be nominal—they can either mean absolutely on and absolutely off, or switching between high and low levels relative to a "background" DC level.

The controller applies this pulse width modulated control signal to the input of a driver such as a buck converter or other type of driver, which drives the load based on the modulation of the control signal. During the on time of each period, the driver supplies current from a power supply to the load, while during the off time of each period the driver does not supply current from the power supply to the load. Hence the average power supplied to the load is dependent on the duty cycle: a higher duty cycle means the current is on for more of the time, and so the average power is higher; while conversely a lower duty cycle means the current is supplied for less of the time, and so the average power is lower.

By controlling the duty cycle (i.e. varying the on time relative to the PWM period or off time), the controller is thus able to control the average power with which the load is driven.

Figure 1:
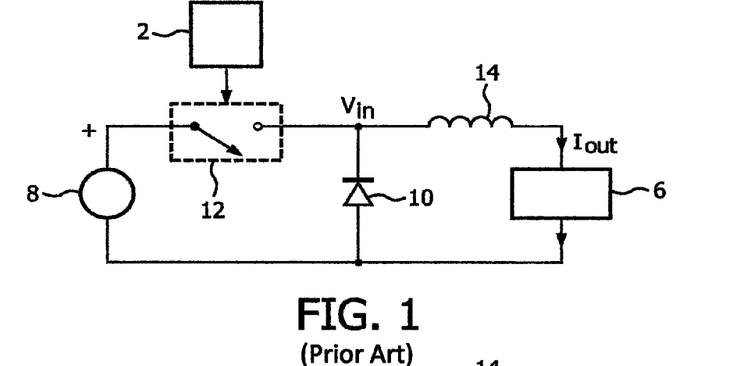
FIG. 1 is a schematic diagram of a buck converter with load and controller.

FIG. 1 is a schematic diagram of a circuit comprising a typical buck converter 4, employed for the purpose of controlling the power to a load based on pulse width modulation. As well as the buck converter 4, the circuit comprises a power supply 8, a load 6 and a controller 2 such as a suitably programmed microprocessor. The buck converter 4 comprises a switch 12, and inductor 14 and a diode 10. The switch 12 has a first contact connected to a second terminal of the power supply 8 (e.g. positive terminal) and a second contact connected to a first terminal of the inductor 14. The inductor 14 has a second terminal connected to a first terminal of the load 6, and the load 6 has a second terminal connected to a first terminal of the power supply 8. The diode 10 has a cathode connected to the first terminal of the inductor 8 (and to the second contact of the switch 12) and an anode connected to the second terminal of the load 6 (and the first terminal of the power supply 8). The switch 12 and power supply 8 are therefore connected in series with one another, and the inductor 14 and load are connected in series with one another, with the series arrangement of inductor 14 and load 6 being connected in parallel across the series arrangement of power supply 8 and switch 12, and the diode 10 also being connected in parallel across the series arrangement of power supply 8 and switch 12 (in reverse bias with the power supply 8).

Figure 2:
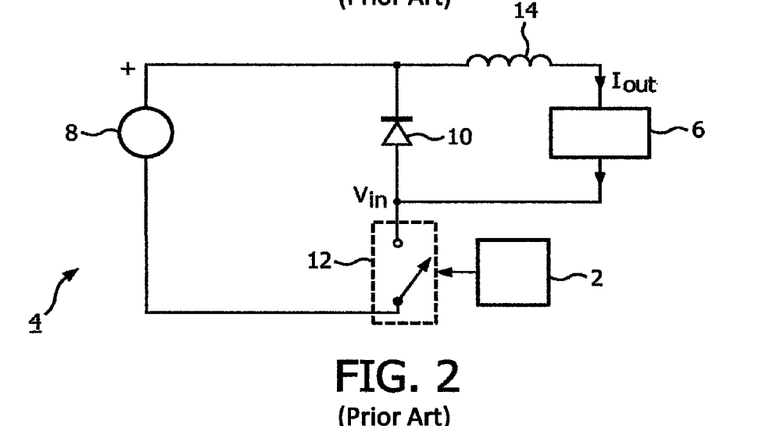
FIG. 2 is a schematic diagram of another buck converter with load and controller.

Note that FIG. 1 shows a buck converter with a high-side switch. An alternative arrangement with a low side switch is shown in FIG. 2. The circuit is the same, except the switch 12 is connected between the other (first) terminal of the power supply and the second terminal of the load 6 (and anode of the diode 10), with the second (e.g. positive) terminal of the power supply 8 being connected to the first terminal of the inductor 8 (and cathode of the diode 8).

Figure 3:
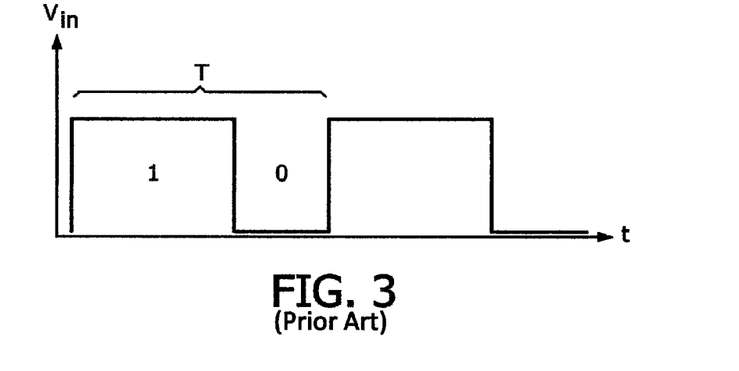
FIG. 3 is a schematic sketch of the input voltage of a buck converter.

In either variant, the controller 2 is arranged to apply the pulse width modulated control signal to the input of the switch 12, thus generating a pulse width modulated input signal in the form of a voltage signal $V_{in}$. When the control signal is on (asserted, e.g. logic 1), the switch 12 is closed connecting the input voltage $V_{in}$ to the supply 8. When the control signal is off (de-asserted, e.g. logic 0), the switch 12 is open and $V_{in}$ is disconnected from the supply 8. As shown in FIG. 3, this results in a rectangular pulse width modulated input voltage $V_{in}$ corresponding to the pulse width modulated control signal generated by the controller 2. This rectangular PWM input waveform is present at the anode of the diode 10 in the case of a high side switch (FIG. 1) or at the cathode in the case of a low side switch (FIG. 2). During the on times when $V_{in}$ is connected to the supply 8, this allows current to flow from the power supply 8 through the inductor 14 and load 6. During the off times when $V_{in}$ is disconnected from the supply, this means no current is supplied from the power supply 8 to the inductor 14 and load 6 (although some current may temporarily flow through the load 6 from the inductor 14 as the inductor de-energizes).

Note however that a buck converter is just one example. In general for drivers of LED lamps or other lamps, other forms of switched-mode power supply may also be used, e.g. a fly-back converter.

The controller 2 governs the duty cycle of the pulse width modulation in order to control the current or power supplied to the load, and therefore its output. Current is the property controlled in the case of LED drivers, but as the voltage drop across an LED is almost constant, this corresponds (almost) proportionally to power. For example in the case of a light source, the pulse width modulation controls the output power or intensity of the emitted light, or in the case of a motor this controls its speed. Many state-of-the-art LED drivers make use of buck converters for controlling the current through the LED(s) and thereby the level of light emitted by the LED(s). The frequency of the PWM waveform typically is of the order of 4 to 16 kHz. State-of-the-art coded light controllers can also encode data into the PWM waveform, by varying its duty cycle in order to produce a DC-free amplitude modulation in the visible light emitted by the LED(s).

SUMMARY

However, as noted, the pulse width modulated control signal is not applied directly to the load but rather via a driver such as a buck converter. In the off state of each period of the PWM waveform, the buck converter supplies no current to the LED(s), but in the on state the buck converter typically pushes "current-packets" at a high frequency (typically between 100 and 800 kHz) to the secondary side of its coil and thus to the LED(s). This may be referred to herein as the "buck switching frequency" (as distinct from the PWM switching frequency). See for example FIG. 4.

The combination of the switching at these two different frequencies can cause issues. Depending on whether a switching edge of the PWM signal coincides with a rising or falling edge of the second, higher frequency, this means the relationship between the PWM waveform duty cycle and the current applied to the load is not necessarily completely linear. E.g. if a falling edge of the PWM input signal $V_{in}$ coincides with a falling edge of one of the higher frequency "wiggles" of the buck converter, the exact switching time of the PWM input signal $V_{in}$ will not influence the current $I_{out}$ supplied to the load, and so the relationship between duty cycle and load current will not be linear.

In the case where the load is a light source such as an LED, the inventors have realized that, as a result of this non-linearity, certain combinations of buck switching frequency and PWM duty cycle will introduce visible flicker into the light emitted by the LED(s), notwithstanding the DC-free encoding of the PWM waveform as generated by the controller 2. More generally, other kinds of driver for driving other loads may also experience high frequency oscillations or harmonics, and the interaction between such frequencies and the PWM switching frequency may also cause unwanted effects such as non-linearity. In practice it may be difficult or even impossible to avoid such combinations of frequencies. A more robust solution may therefore be desirable.

According to one aspect disclosed herein there is provided a circuit comprising: a controller for controlling a pulse width modulated input signal, and a driver configured to supply current to a load based on the input signal. As it is pulse width modulated, the input signal has a period comprising an on time and on off time, with this period repeating at a first frequency; and the controller is configured to control a duty cycle of the input signal, the duty cycle being a proportion of the on time relative to the period or off time. Over the off time of each period the driver withholds supply of current from a power supply to the load, and over the on time of each period the driver supplies current from the power supply to the load but with a second frequency that is greater than the first frequency. Based on this pulse width modulation, the load thus generates an output at a level dependent on the duty cycle. Furthermore, in accordance with the present disclosure, the controller is configured to apply a "dithering" to the duty cycle. That is, the controller uses the duty cycle to set the output of the load to a desired output level, but also dithers the duty cycle about a point corresponding to the desired output level.

The dithering advantageously enables the controller to avoid or at least mitigate unwanted artefacts in the relationship between the duty cycle and the output of the load caused by the interaction between the second frequency (e.g. buck switching frequency) and the first frequency (PWM frequency).

In preferred embodiments, the circuit further comprises a feedback channel from the driver to the controller for measuring the second frequency, wherein the controller is configured to adapt the dithering in dependence on the second frequency as measured via said feedback channel.

In embodiments, the controller may be configured to control the duty cycle to switch the output of the load to a plurality of different output levels, and said dithering may comprise dithering the duty cycle about each of a plurality of points corresponding to said different output levels respectively.

In embodiments, the load comprises a light source and the output comprises light emitted by the light source. The controller may be configured to control the duty cycle to switch the light emitted by the load to a plurality of different light output levels. According to coded light techniques, the controller may be configured to code a data signal into said light by using the different output levels to signal symbols of the data signal. In such embodiments, the controller may configured to dither the duty cycle about each of a plurality of points corresponding to the different light output levels respectively. In coded-light applications where the duty cycle is an effectively random variable (corresponding to encoded information), in embodiments this dithering can mitigate the phenomenon of visible flicker.

Figure 5:
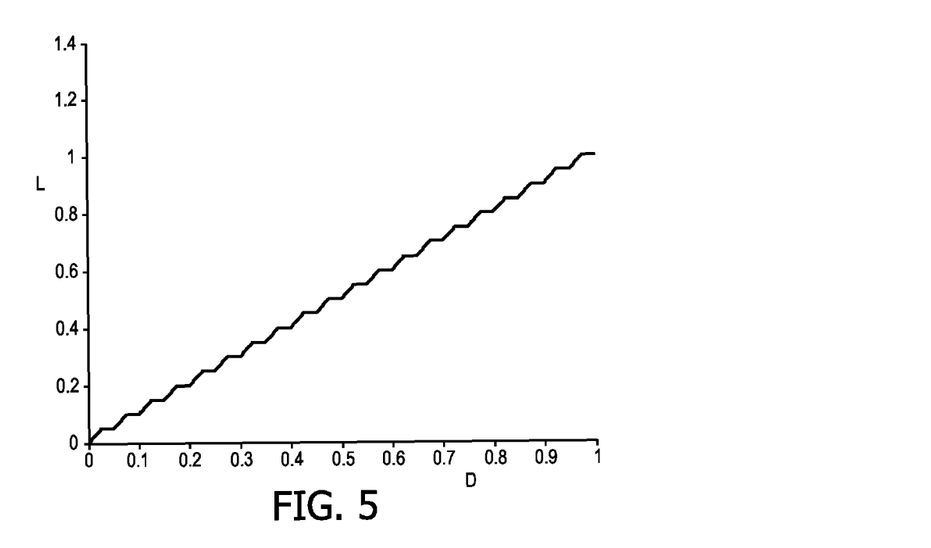
FIG. 5 is graph illustrating output level versus duty cycle of a buck converter input.

In embodiments, the output of the load varies according to a relationship between the duty cycle and the level of the output, and the first and second frequencies in combination may result in a pattern in this relationship that repeats in regular intervals of the duty cycle (e.g. see FIG. 5). The load may comprise a light source and the output may comprise light emitted by the light source, said relationship being the relationship between the duty cycle and the level of said light.

In embodiments the duty cycle may be dithered in a plurality n of discrete steps about said point or about each of said points. The duty cycle may be dithered about said point or each of said points in n steps of P/n where P is said interval. The dithering may be random with each of the n steps having a 1/n probability of being selected per period.

In embodiments, the feedback channel may comprise a voltage divider or a differential circuit.

According to another aspect disclosed herein, there may be provided a computer program product comprising code embodied on a computer-readable storage medium and adapted so as when executed on one or more processors to perform operations of: causing a pulse width modulated input signal to be provided to a driver which supplies current to a load based on the input signal, wherein the input signal has a period comprising an on time and on off time with said period repeating at a first frequency, and wherein over the off time of each period the driver withhold supply of current from a power supply to a load, and over the on time of each period the driver supplies current from the power supply to the load with a second frequency that is greater than the first frequency; controlling a duty cycle of the input signal being a proportion of the on time relative to said period or off time, in order to set the output of the load to a desired output level; and dithering the duty cycle about a point corresponding to the desired output level.

In embodiments the computer program product may be further configured in accordance with any of the controller features disclosed herein.

BRIEF DESCRIPTION OF THE DRAWINGS

To assist the understanding of the present disclosure and to show how embodiments may be put into effect, reference is made by way of example to the accompanying drawings in which.

DETAILED DESCRIPTION OF EMBODIMENTS

As discussed, state-of-the-art drivers for LED illumination are characterized by an irregular (non-linear) mapping of input PWM duty cycle to the generated output light level. In the case of coded light transmission, this may lead to a loss of the DC-free property of the modulation system, resulting in visible flicker. As will be explained in more detail below, it has been found that this flicker can be mitigated to levels below the visibility threshold by applying dither to the input of the driver.

State-of-the-art LED drivers often make use of buck converters for controlling the current through the LED to obtain the desired light output. In case of a PWM-controlled driver, a controller 2 (e.g. a suitably programmed microprocessor) governs the duty cycle of a PWM (0,1)-waveform. The frequency of this PWM waveform typically is of the order of 4 to 16 kHz (or even higher). In the "0"-state of each PWM period, no current is fed to the LED, while in the "1"-state, a buck converter typically pushes "current-packets" at a high frequency (typically between 100 and 800 kHz) to the secondary side of its coil 14, thus energizing the LED. This higher "buck switching frequency" is dependent on the load through an impedance seen on the input. Usually the current at this second, much higher frequency is somewhat low-pass filtered (a capacitor), before actually sending it to the load, but is nonetheless present. It is typically at least one order of magnitude (ten times) higher than the PWM frequency.

The duty cycle of the pulse width modulation controls the average current supplied to the LED 6 and therefore the level of light output by the LED.

Such an arrangement can be used to generate coded light, whereby data is embedded into the visible light emitted from a light source such as an LED or array of LEDs. One way of doing this is to modulate the level of the emitted light, which can be achieved by varying the input duty cycle (and therefore the output light level) between a plurality of discrete values in order to represent different symbols. For example, in one scheme developed by the applicant and referred to as "Ternary Manchester", five different levels are used to encode the data symbols. Ternary Manchester is described in WO2012052935.

Figure 4:
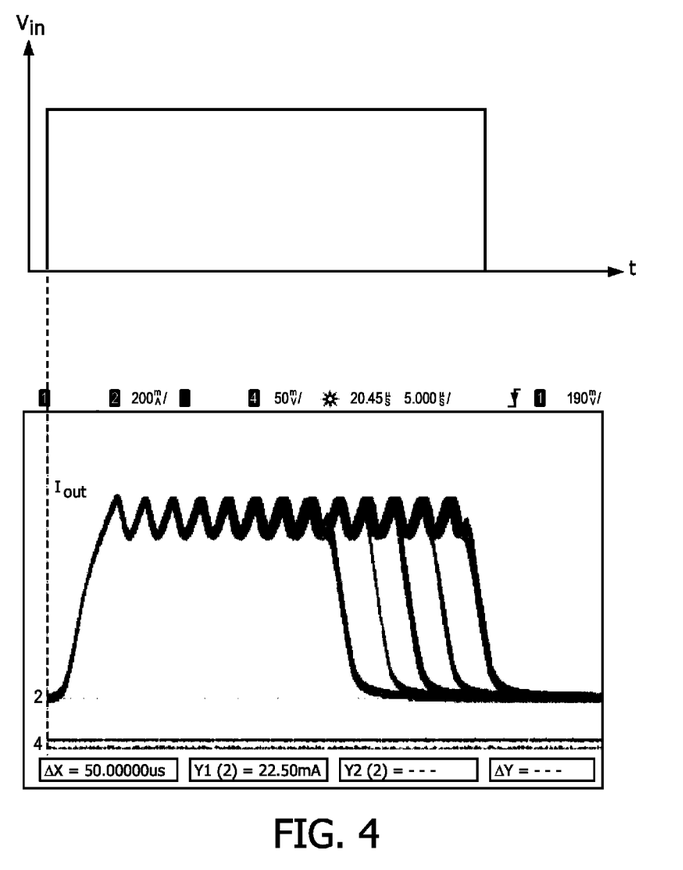
FIG. 4 is a timing diagram showing the output current of a buck converter.

FIG. 4 shows the output current of a PWM-controlled buck converter 4. On the left can be seen the onset of the "1" state in a single PWM period, governed by the controller 2 (e.g. microprocessor). On the right side can be seen the switch to the "0" state for the five different PWM durations that correspond to the five modulation levels of "Ternary Manchester" coded light. The wiggles at the top of the trace correspond to the higher frequency on/off switching of the buck converter 4 during the "1" state of the PWM period.

FIG. 5 shows the resulting mapping of input duty cycle D (as applied by the controller 2) to the average output light level L of the LED in terms of current or power, which may also be referred to as the transfer function of the driver 4. For an LED, the light output power is (approximately) proportional to current (because the voltage drop across an LED is almost constant). Note the horizontal plateaus, where the average light output does not increase while the duty cycle increases. These plateaus correspond to the switching to the "0" state of the PWM input signal while being on a falling edge of one of the "wiggles" caused by the buck converter in FIG. 4. As the buck converter 4 is switched "off" during a falling edge of each wiggle, the exact switching time of the PWM input signal within a falling edge has no influence on the current "pushed" to the secondary side of the buck converter 4, thus leading to a constant light output. These malformations (bumps or imperfections) in the otherwise-linear relationship repeat at regular intervals with duty cycle intervals, i.e. are cyclical in duty-cycle space (on the duty cycle scale). In the example of FIG. 5 (and FIGS. 6, 7, 10 and 11) the buck converter "period" is an interval of 0.05 in duty-cycle.

A problem can arise in using the afore-mentioned LED drivers for the generation of coded light.

Figure 6:
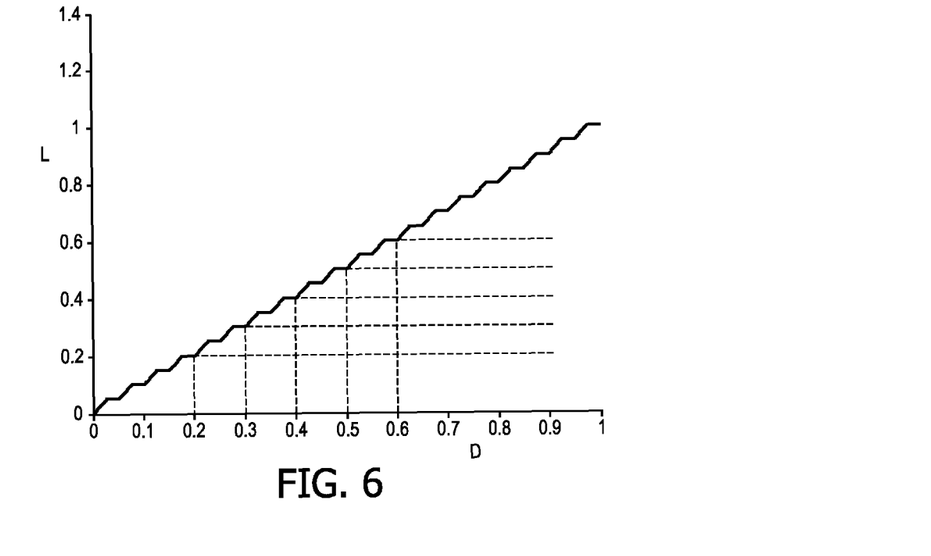
FIG. 6 is another graph illustrating output level versus duty cycle.

The waveforms used for coded light (actually, deviations from the average required illumination) may be carefully picked to not generate any flicker, i.e. they contain no low frequencies. A typical example is Ternary Manchester (TM), that uses five different levels (in this case PWM duty cycles), e.g., the set {0.2, 0.3, 0.4, 0.5, 0.6}. See FIG. 6. The average light level in this example equals 0.4. Different levels are used sequentially for transmitting information in such a manner, that the deviations from 0.4 have no low-frequency content, i.e. they cause no flicker. In the example of FIG. 6, it can be seen that the output light levels are also spaced equidistant, i.e. a balanced input also results in a balanced output. In this case this happens because the PWM frequency and duty cycle levels have been carefully chosen to have exactly two "periods" of the buck converter in duty cycle space (i.e. two intervals in the pattern of FIG. 4) between any two consecutive levels. However in general this will not be the case.

Figure 7:
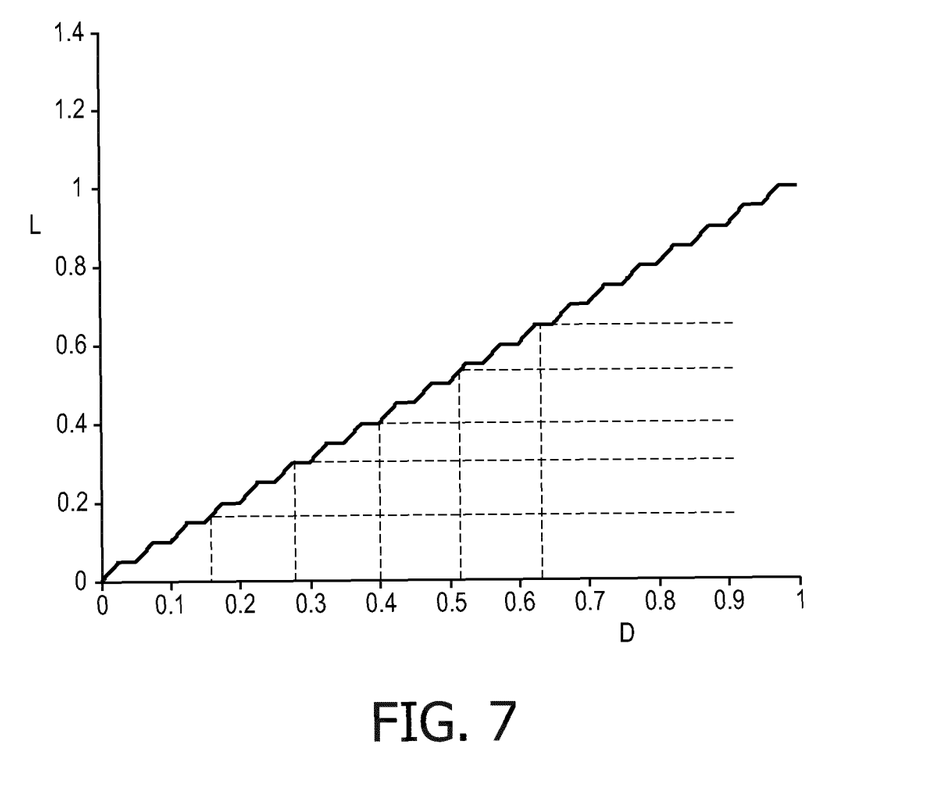
FIG. 7 is another graph illustrating output level versus duty cycle.

FIG. 7 shows the case where the same driver 4 is used while having a 20% larger modulation amplitude of the coded light Ternary Manchester symbols. Note that in this case an equidistant spacing of the input PWM duty cycles leads to a non-equidistant spacing of the resulting output light levels, which in turn destroys the DC-free property of the code, i.e. flicker is generated because the average light level during transmission of Ternary Manchester coded light is not equal to the average light level in absence of Ternary Manchester transmission (0.4 in the example of FIG. 7). It will be appreciated that similar issues may occur in other coding schemes based on other sets of symbols.

To address this, the present disclosure provides a form of "dithering" whereby a duty cycle of the encoded PWM waveform is adapted in dependence on the buck switching frequency. A feedback channel is added from the buck converter 4 to the controller 2 (e.g. to the microprocessor), so that the controller 2 can suitably adapt the duty cycle of the PWM waveform. The fact that the mapping between light output and duty cycle looks like a linear function with some periodic "deformities" on top (FIG. 5), makes the dithering approach particularly effective.

Figure 8:
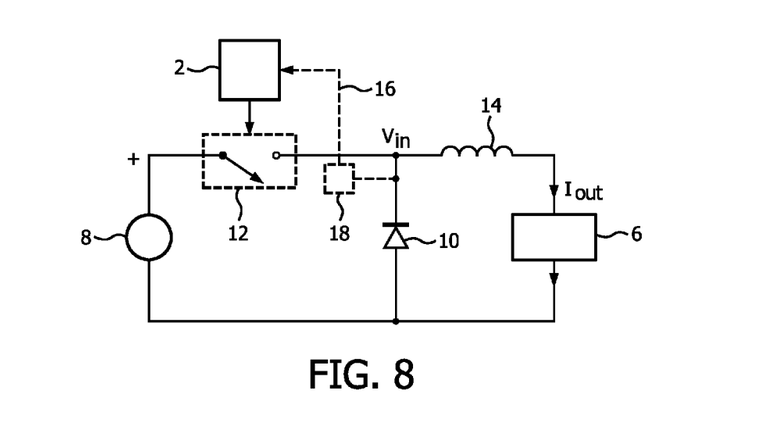
FIG. 8 is a schematic diagram of another buck converter with load and controller.
Figure 9:
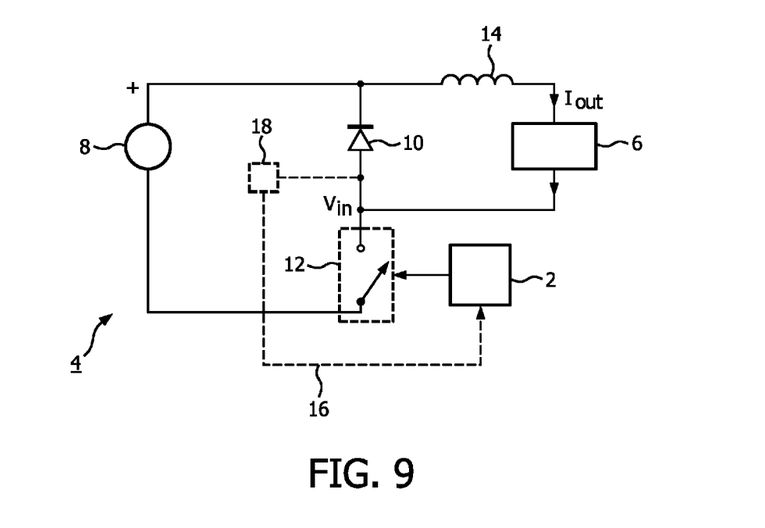
FIG. 9 is a schematic diagram of another buck converter with load and controller.

FIGS. 8 and 9 show two buck converter implementations incorporating a feedback channel 16. FIG. 8 shows an implementation based on a high side switch and FIG. 9 shows an implementation based on a low side switch, similar to FIGS. 1 and 2 respectively but incorporating the feedback channel 16.

In FIG. 8 (high side switch), the buck switching frequency is obtained by measuring the large potential variations at the cathode of the diode 10. Hence the feedback channel 16 is connected between the cathode of the diode 10 and an input of the controller 2.

In FIG. 9 (low side switch), the voltage at the anode with respect to ground can be used to measure the switching frequency. Hence the feedback channel is connected between the anode of the diode 10 and an input of the controller 2.

The feedback channel 16 may comprise additional measurement circuitry 18 between the anode or cathode of the diode 10 and the microcontroller. This may be desirable due to the large voltages (>3.3V) that may be experienced at the anode or cathode. For example the measurement circuit 18 may be a voltage divider in case the supply and load voltage are relatively constant, or a differential circuit that also avoids leakage current through the LEDs (leakage current would keep the LEDs 6 glowing even if the buck converter 4 is switched off).

As will be discussed in more detail in the following, dithering can be used to decrease the local non-linearity of a buck converter 4 operating in hysteretic current mode where the output current is modulated by enabling and disabling the entire converter using pulse width modulation (PWM).

The dithering is implemented by the controller 2 based on the feedback. The controller may be implemented in the form of code stored on storage medium (memory) and arranged for execution on a microcontroller or more generally processor. Alternatively it is not excluded that some or all of the controller 2 could be implemented in dedicated hardware circuitry, or configurable or reconfigurable hardware circuitry such as a PGA or FPGA.

By applying dither (small deviations) to the input levels, the flicker caused by the non-uniform spacing of the output light levels can be alleviated. In an example application, each Ternary Manchester symbol has a duration of 1 ms, while the PWM frequency is 16 kHz, i.e. once a certain modulation duty cycle input has been picked, the same duty cycle input is used for sixteen consecutive PWM periods (in case of no dither). By dithering these sixteen duty cycle inputs for all Ternary Manchester symbols, an average light output is created for each of the symbols that is much more regularly spaced than the non-dithered version, thus mitigating flicker. As similar approach can also be used for other coding schemes.

As discussed, the actual transfer function between a microprocessor-controlled input and average light level output is characterized by local small scale malformations, e.g. as in FIG. 4. The following uses dither for creating a "linearized average" transfer function between the microprocessor-controlled input and the light output.

Figure 10:
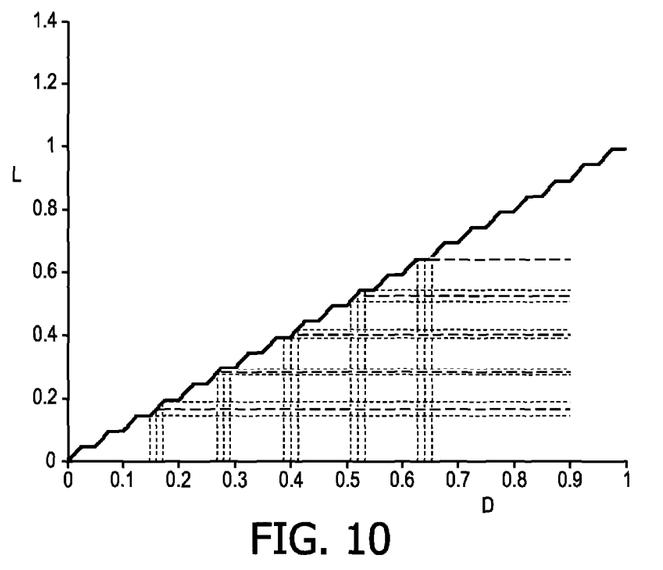
FIG. 10 is another graph illustrating output level versus duty cycle.

For instance refer to the example of FIG. 10, where the length of the horizontal stretches in duty cycle (i.e. the width of the dither) equals half of $P_{bc}$, where $P_{bc}$ is the "period" of the "buck cycle intervals". Each input duty cycle $dc_{in}$ may be replaced by the average of two inputs, one shifted ¼ of $P_{bc}$ to the right, and the other shifted ¼ of Pbc to the left (see the two side vertical dotted lines in FIG. 10 about each central dotted line, representing the two shifted positions and the notional center position between them). It can be shown that in this case the average of each pair creates an output, represented by the five bold horizontal lines in FIG. 10, which have an equal spacing between each consecutive pair, i.e. no flicker. This now holds for every average light output and any valid modulation depth.

In the example of FIG. 10, the buck cycle period $P_{bc}$=0.05, the modulation depth=0.24, and the dither spacing is 0.025. The DC content without the two-level dither was found to be 0.199 and the DC content with the two-level dither was found to be $-8.8818 \times 10^{-16}$. Hence one can see the effectiveness of even a simple dither for linearizing a periodic disruption of non-linearity.

Note however, that in the above-described embodiment using two-level dithering, the result of no residual flicker only holds if $P_{bc}$ is known at the controller 2 controlling the PWM duty cycle (and generating the dither), and if the length of the horizontal stretches equals half of $P_{bc}$.

If any of these conditions is not true, a complete linearization of the transfer function will not in general be obtained, and a residual reduced flicker may remain. In this case an n-level dither is of help.

Figure 11:
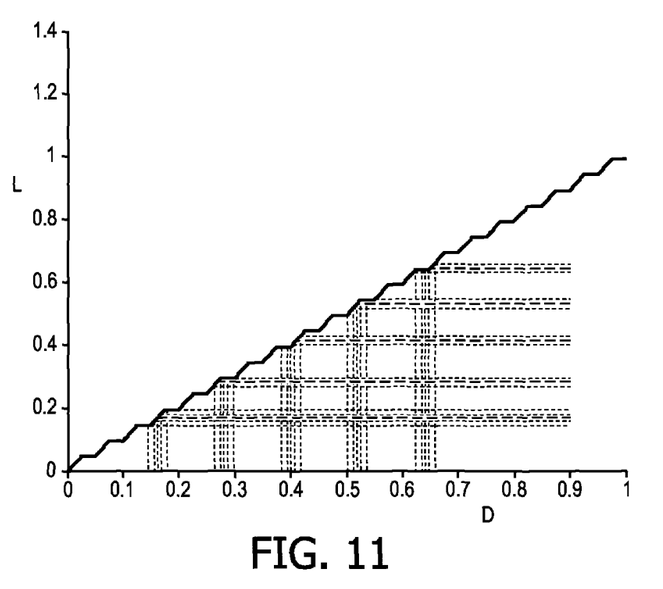
FIG. 11 is another graph illustrating output level versus duty cycle.

FIG. 11 depicts the situation for n-level dither, where n=4. It turns out that a significant reduction of flicker is still obtained even if $P_{bc}$ is not exactly known, or if the length of the horizontal stretches (dither width) does not equal half of $P_{bc}$.

In the example of FIG. 11, the buck cycle period $P_{bc}$=0.05, the modulation depth=0.24, and the dither spacing is 0.025. The DC content without the two-level dither was found to be 0.199 and the DC content with the four-level dither was found to be substantially 0.

In embodiments, the controller 2 is configured to implement the dithering according to one, some or all of the following:

apply n-level dithering to the input duty cycles corresponding to each of the transmitted modulation symbols of coded light;

the spacing between each consecutive pair of dither amplitudes is as close as possible to $P_{bc}/n$, where $P_{bc}$ corresponds to the cyclic malformation in the mapping between duty cycle input and light output (e.g. see FIG. 4);

each element of the set of n dither amplitudes belonging to a single symbol is used with a uniform probability 1/n;

in general, a larger n tends to do a better job than a smaller n;

in case the ratio of the horizontal stretch length (overall dither width) to $P_{bc}$ is known, it is advantageous to pick n such that a k, 1≤k≤n−1 exists for which k/n is close to the afore-mentioned ratio;

in case n=4, there are groups of four consecutive PWM symbols, each group having four different dithered PWM amplitudes; and/or in case n=4, if "0", "1", "2" and "3" correspond to the four different dithered PWM amplitudes belonging to a single symbol in order of increasing amplitude (or duty cycle), the order in which these ditherings should appear temporally in a group equals that equals "0", "3", "2", "1".

FIGS. 12 to 17 show the DC imbalance (reflecting the generated flicker) of a given packet of the V2 format (consisting of the all-zero pattern 9 "0"'s) for different settings of parameters. For each set of parameters, the value of the "0" input (see FIG. 6) is varied over 1 period $P_{bc}$. The bold solid line (i) represents the case of no dither, the non-bold solid line (ii) represents a two-level dither, and the dotted line (iii) represents a four-level dither.

Figure 12:
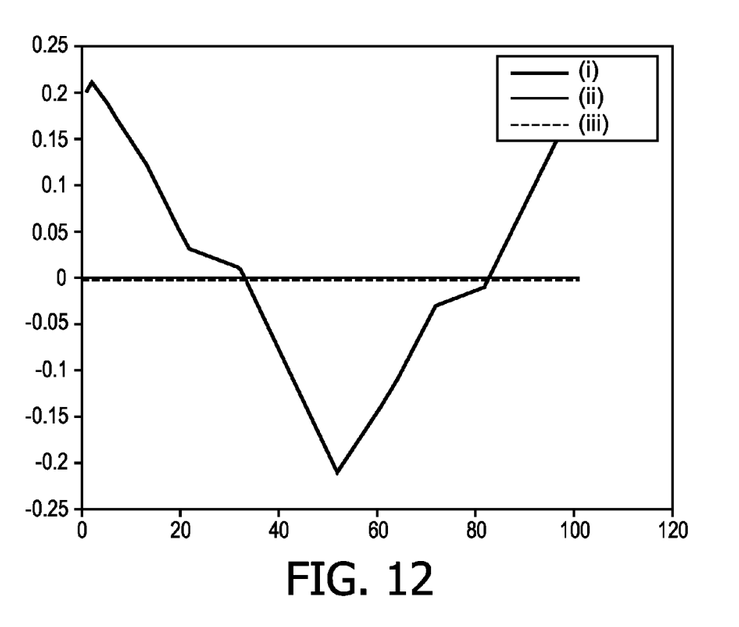
FIG. 12 is a graph illustrating DC content in an output of a buck converter versus phase.

FIG. 12 shows an example with the horizontal stretch= 0.5 $P_{bc}$, with $P_{bc}$ estimated exactly and a modulation depth of 0.24.

Figure 13:
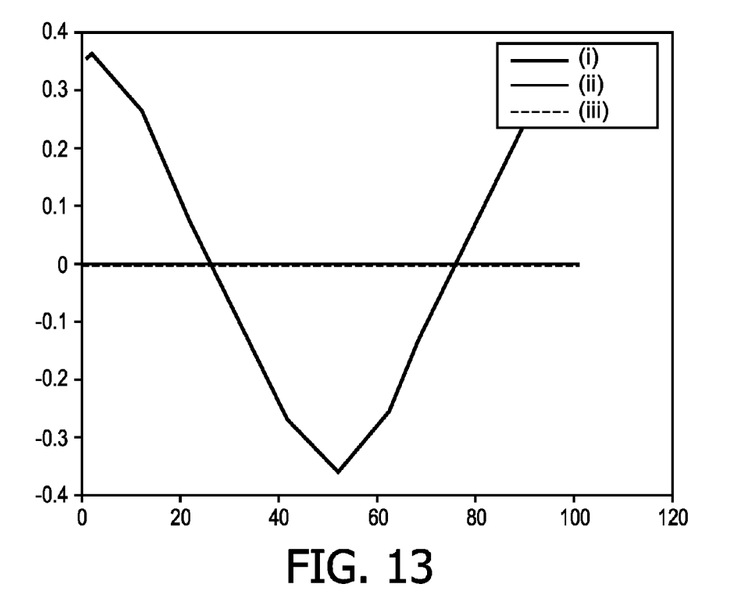
FIG. 13 is another graph illustrating DC content versus phase.

FIG. 13 shows an example with the horizontal stretch=0.5 Pbc, Pbc estimated exactly and a modulation depth of 0.28.

Note that in FIG. 12, already two-level dither reduces the DC content to 0, because $P_{bc}$ is estimated exactly and the horizontal stretch of the dither is exactly half of $P_{bc}$. Note also that in FIG. 12 the modulation depth is chosen not to contain an integer number of buck periods. The modulation depth in FIG. 13 (0.28) has been chosen to give the worst possible DC content if no dithering is used.

Figure 14:
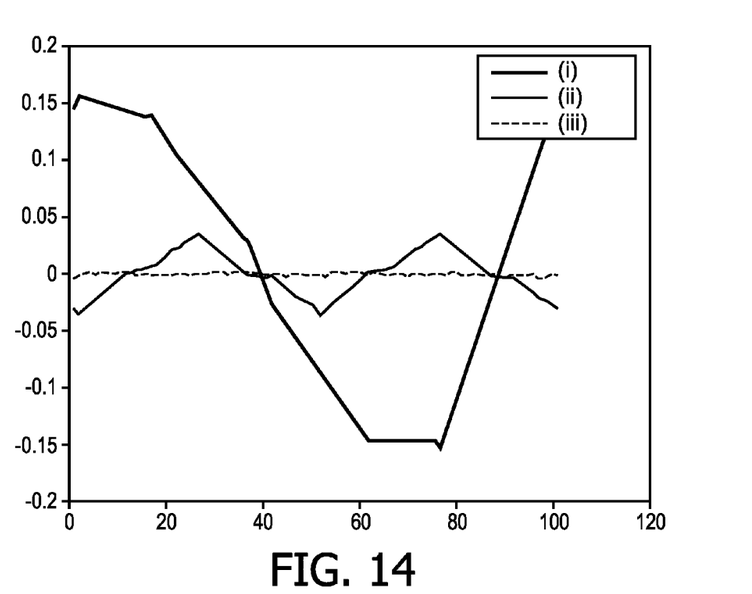
FIG. 14 is another graph illustrating DC content versus phase.

FIG. 14 shows an example with horizontal stretch=0.25 $P_{bc}$, $P_{bc}$ estimated exactly and a modulation depth of 0.28.

Figure 15:
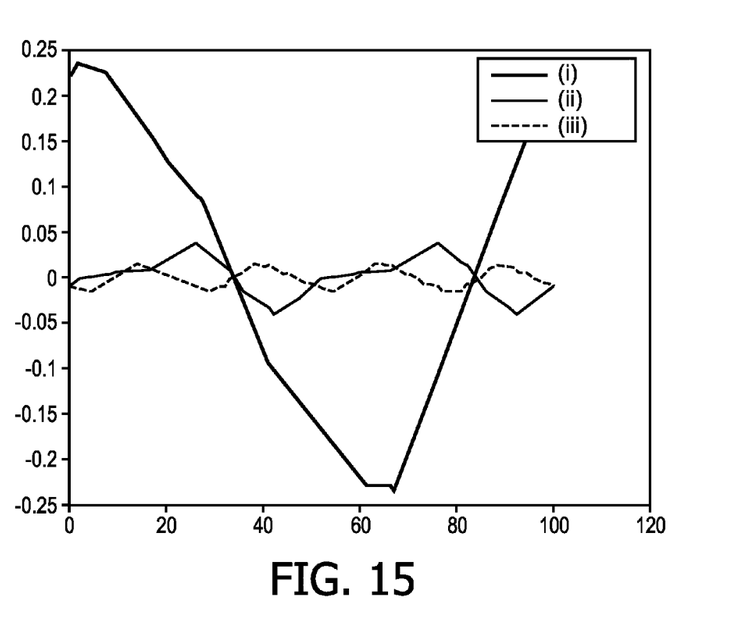
FIG. 15 is another graph illustrating DC content versus phase.

FIG. 15 shows an example with horizontal stretch=0.33 $P_{bc}$, $P_{bc}$ estimated exactly and modulation depth: 0.28.

Figure 16:
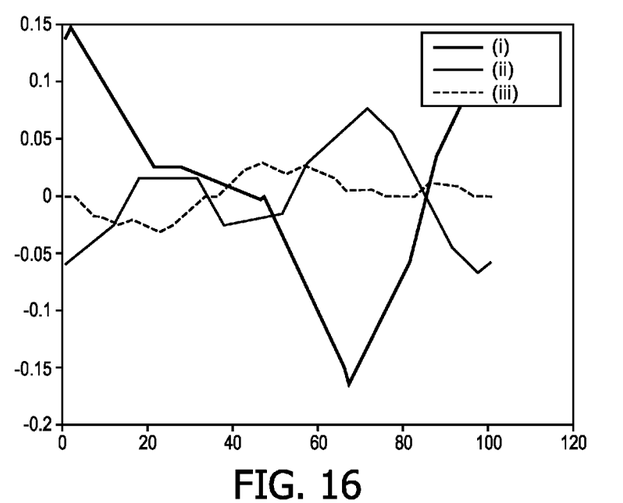
FIG. 16 is another graph illustrating DC content versus phase.

FIG. 16 shows an example with horizontal stretch=0.33 $P_{bc}$, $P_{bc}$ estimated 20% off, and modulation depth 0.24.

Figure 17:
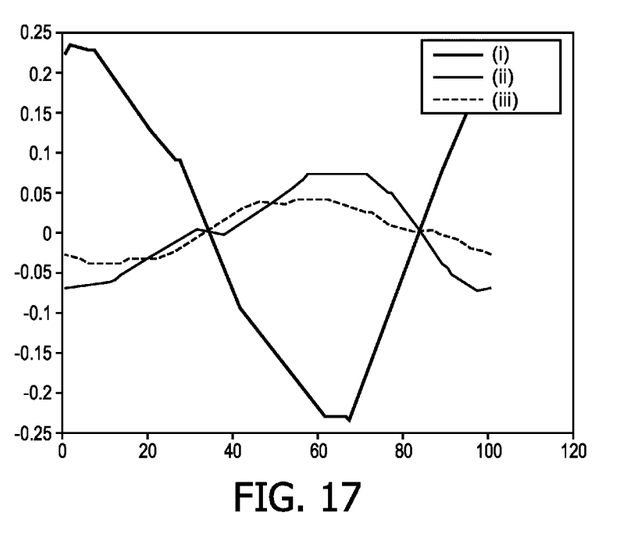
FIG. 17 is another graph illustrating DC content versus phase.

FIG. 17 shows an example with horizontal stretch=0.33 $P_{bc}$, $P_{bc}$ estimated 20% off, and modulation depth: 0.28.

Note: the above has provided various examples of how the dithering can be adapted based on $P_{bc}$, which is the buck cycle "period", i.e. the interval of regular repetition in the duty cycle domain of the cyclic imperfections (or "bumps") in the relationship between duty cycle D and output level L (e.g. see FIGS. 5-7). As also mentioned above, in embodiments the dithering is adapted based on feedback of the buck frequency $f_{buck}$ (or second frequency), i.e. the frequency of the higher frequency modulation (or "wiggles") in the time domain (see FIG. 4). Furthermore, it has been explained how the regular interval $P_{bc}$ in the duty cycle domain is related to the buck frequency $f_{buck}$ (or second frequency) in the time domain, and hence it will be seen that knowing $f_{buck}$ enables the adaptation of the dithering interval based on the examples expressed in terms of $P_{bc}$.

Particularly, it has been explained above that the regular imperfections shown in FIGS. 5-7 occur because at some duty cycle values the falling edge of the PWM waveform coincides with a trough of the higher frequency buck frequency "wiggles" (see FIG. 4), while at other duty cycle values the falling edge of the PWM waveform coincides with a peak of the buck frequency. Thus if one imagines sweeping the duty cycle value from 0% to 100%, so that the falling edge of the PWM waveform sweeps left to right in FIG. 4, then the falling edge of the PWM waveform regularly encounters a trough of the buck frequency, then a peak of the buck frequency, then another trough of the buck frequency, then another peak of the buck frequency, and so forth. Thus when the relationship between duty cycle and output level is plotted with duty cycle on the horizontal axis, then the regular "bumps" of FIGS. 5-7 appear.

The relationship between $P_{bc}$ and $f_{buck}$ will be readily understood by a skilled person from this explanation. Imagine again sweeping the duty cycle from 0% to 100%, which corresponds to sweeping the falling edge of the PWM waveform from left to right across the range of one PWM cycle T (again see FIG. 4). During this process, one would encounter $T_{buck}$ peaks of the buck frequency waveform, where $T_{buck}$ is the period $1/f_{buck}$ of the buck frequency $f_{buck}$ in the time domain. That is, as duty cycle varies, one encounters $T_{buck}$ peaks per PWM period T, so along the duty cycle axis (FIGS. 5-7) the pattern of bumps repeats with interval $P_{bc}=T_{buck}/T$.

Hence in combination with the examples of setting the dither based on $P_{bc}$ above, it will be understood how feedback of the buck frequency (or second frequency) can be used to adapt the dithering.

It will be appreciated that the above embodiments have been described by way of example only.

For instance, while the above has been described in terms of a buck converter, similar issues may occur in any driver where, during an on phase of the pulse width modulation, current is supplied with a frequency that is higher than the PWM frequency. I.e. other drivers such as fly-back converters may experience harmonics or oscillations which, in combination with the switching at the pulse width modulation frequency, may cause issues such as non-linearity. Further, the techniques disclosed herein may be applicable to other applications other than coded light, or to other loads than LEDs or light sources. For example it may be desired to dim the illumination emitted by a luminaire in a more linear fashion, or control the speed of a motor or control the output of some other load in a more linear fashion. Further, it is not necessary in all embodiments to have actuate feedback of the frequency via a feedback channel or even any feedback at all. The dithering can still do a good job of improving linearity even if the buck switching frequency is only known approximately (e.g. with 50% error), and in fact the dither solution is sufficiently robust such that it can deal with small variations even without feedback.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit comprising:
  a driver; and
  a controller for controlling a pulse width modulated input signal applied to the driver, the input signal having a period comprising an on time and an off time with said period repeating at a first frequency, and the controller being configured to control a duty cycle of the input signal being a proportion of the on time relative to the period or off time;
  wherein the driver is configured to supply current to a load based on the input signal, wherein over the off time of each period the driver withholds supply of current from a power supply to the load, and over the on time of each period the driver supplies current form the power supply to the load but with a second frequency that is greater than the first frequency, the load thus generating an output at a level dependent on the duty cycle;

wherein the controller is configured to control the duty cycle to set the output of the load to a desired output level, and to dither the duty cycle about a point corresponding to the desired output level; and wherein the circuit further comprises a feedback channel from the driver to the controller, wherein the feedback channel is configured to measure the second frequency and wherein the controller is configured to adapt the dithering of the duty cycle in dependence on the second frequency as measured by said feedback channel.

2. The circuit of claim 1, wherein the controller is configured to control the duty cycle to switch the output of the load to a plurality of different output levels, and said dithering comprises dithering the duty cycle about each of a plurality of points corresponding to said different output levels respectively.

3. The circuit of claim 1, wherein the load comprises a light source and the output comprises light emitted by the light source.

4. The circuit of claim 3, wherein the controller is configured to control the duty cycle to switch the light emitted by the load to a plurality of different light output levels.

5. The circuit of claim 4, wherein the controller is configured to code a data signal into said light by using the different light output levels to signal symbols of the data signal.

6. The circuit of claim 4, wherein the controller is configured to perform said dithering by dithering the duty cycle about each of a plurality of points corresponding to the different light output levels respectively.

7. The circuit of claim 1, wherein:
the output of the load varies according to a relationship between the duty cycle and the level of the output; and
the first frequency and the second frequency in combination result in a pattern in the relationship between the duty cycle and the level of the output that repeats in regular intervals of the duty cycle.

8. The circuit of claim 7, wherein the load comprises a light source and the output comprises light emitted by the light source, said level of the output being a level of said light and said relationship being between the duty cycle and the level of said light.

9. The circuit of claim 7, wherein the duty cycle is dithered in a plurality n of discrete steps about said point.

10. The circuit of claim 9, wherein the duty cycle is dithered about said point in n steps of P/n where P is a period of said regular intervals of the duty cycle.

11. The circuit of claim 9, wherein the dithering is random with each of the n steps having a 1/n probability of being selected per period.

12. The circuit of claim 1, wherein the driver is a buck converter.

13. The circuit of claim 1, wherein the feedback channel comprises a voltage divider or a differential circuit.

14. A computer program product comprising code embodied on a non-transitory computer-readable storage medium and adapted to, when executed by one or more processors, perform operations comprising:
causing a pulse width modulated input signal to be provided to a driver which supplies current to a load based on the input signal, wherein the input signal has a period comprising an on time and an off time with said period repeating at a first frequency, and wherein over the off time of each period the driver withholds supply of current from a power supply to a load, and over the on time of each period the driver supplies current from the power supply to the load with a second frequency that is greater than the first frequency;
controlling a duty cycle of the input signal being a proportion of the on time relative to said period or off time, in order to set an output of the load to a desired output level; and
measuring the second frequency; and
dithering the duty cycle about a point corresponding to the desired output level based on the measured second frequency.

* * * * *